United States Patent
Hao et al.

(10) Patent No.: US 10,666,196 B2
(45) Date of Patent: May 26, 2020

(54) CRYSTAL OSCILLATOR CONTROL CIRCUIT AND ASSOCIATED OSCILLATION DEVICE

(71) Applicant: Artery Technology Co., Ltd., Chongqing (CN)

(72) Inventors: Baotian Hao, Chongqing (CN); Weitie Wang, Chongqing (CN); Chao Li, Chongqing (CN)

(73) Assignee: Artery Technology Co., Ltd., Chongqing (CN)

( * ) Notice: Subject to any disclaimer, the term of this patent is extended or adjusted under 35 U.S.C. 154(b) by 0 days.

(21) Appl. No.: 16/238,491

(22) Filed: Jan. 2, 2019

(65) Prior Publication Data

US 2020/0076368 A1    Mar. 5, 2020

(30) Foreign Application Priority Data

Aug. 31, 2018   (CN) .......................... 2018 1 1009397

(51) Int. Cl.
*H03B 5/36*     (2006.01)
*H03L 3/00*     (2006.01)
*H03B 5/06*     (2006.01)

(52) U.S. Cl.
CPC .............. *H03B 5/362* (2013.01); *H03B 5/06* (2013.01); *H03L 3/00* (2013.01); *H03B 2200/0058* (2013.01); *H03B 2200/0062* (2013.01); *H03B 2200/0066* (2013.01); *H03B 2200/0094* (2013.01)

(58) Field of Classification Search
CPC . H03B 5/36; H03B 5/362; H03B 5/06; H03B 2200/0058; H03B 2200/0062; H03B 2200/0066; H03B 2200/0094; H03L 3/00
See application file for complete search history.

(56) References Cited

U.S. PATENT DOCUMENTS

| | | | |
|---|---|---|---|
| 7,123,113 B1* | 10/2006 | Brennan | H03L 5/00 331/158 |
| 8,183,947 B2* | 5/2012 | Casagrande | H03B 5/364 331/116 FE |
| 2010/0259335 A1* | 10/2010 | Martin | H03B 5/364 331/116 FE |

FOREIGN PATENT DOCUMENTS

CH              689088 A5 *  9/1998   ............. H03B 5/364

* cited by examiner

*Primary Examiner* — Ryan Johnson
(74) *Attorney, Agent, or Firm* — Winston Hsu

(57) ABSTRACT

A crystal oscillator control circuit includes a first terminal and a second terminal, a current source, and a peak detection and bias voltage adjustment circuit. The first terminal and the second terminal are arranged to couple the crystal oscillator control circuit to a crystal. The current source is coupled to a power supply voltage and generates a bias current. The peak detection and bias voltage adjustment circuit is coupled between the bias current and a ground voltage and coupled to the first terminal, and performs peak detection and bias voltage adjustment to correspondingly generate a first signal at a node. The low-pass filter low-pass filters the first signal to generate a filtered signal. The feedback control circuit is arranged to perform feedback control according to the filtered signal to generate an oscillation signal at one or both of the first terminal and the second terminal.

15 Claims, 3 Drawing Sheets

CRYSTAL OSCILLATOR CONTROL CIRCUIT AND ASSOCIATED OSCILLATION DEVICE

BACKGROUND OF THE INVENTION

1. Field of the Invention

The present invention relates to an oscillator, and more particularly, to a crystal oscillator control circuit and associated oscillation device.

2. Description of the Prior Art

A crystal oscillator may use a resistor as a feedback device of a gain stage. Another option for implementing the feedback device may be an analog switch, such as an analog Metal Oxide Semiconductor Field Effect Transistor (MOSFET) switch. When Complementary Metal-Oxide-Semiconductor (CMOS) process is applied, resistors may cause unwanted cost due to occupying a large area, while resistance of the analog switch may be sensitive to process, power supply and temperature. Further, when signal amplitude is large, the analog switch may introduce an unbalanced DC voltage between the input and the output.

Aside from the above problems, there are further issues. In order to make the crystal oscillator less sensitive to the Printed Circuit Board (PCB) leakage current, a related art technique suggests that an on-chip capacitor series with a resistor may be inserted between the input and output. As this resistor occupies an extremely large area in a low frequency crystal oscillator design, however, this results in tremendous increases in cost. In another example, the crystal oscillation amplitude may be limited by a loop to reduce the circuit power, thus requiring an Automatic Gain Control (AGC) loop and a low-pass filter (LPF). According to the related art, this objective cannot be achieved without applying a resistor or an analog switch; thus there is a trade-off between how to solve problems existing in the art and how to mitigate problems newly-introduced by the solutions.

Therefore, there is a need for a novel architecture to improve the overall performance of an electronic system without introducing a side effect or in a way that less likely to introduce a side effect.

SUMMARY OF THE INVENTION

An objective of the present invention is to provide a crystal oscillator control circuit and associated oscillation device, in order to solve the above-mentioned problems.

An objective of the present invention is to provide a crystal oscillator control circuit and associated oscillation device which can achieve an optimal performance without introducing a side effect or in a way that less likely to introduce a side effect.

At least one embodiment of the present invention provides a crystal oscillator control circuit. The crystal oscillator control circuit comprises a first terminal and a second terminal, a current source, a peak detection and bias voltage adjustment circuit, a low-pass filter, and a feedback control circuit. The first terminal and the second terminal are arranged to couple the crystal oscillator control circuit to a crystal. The current source is coupled to a power supply voltage, and arranged to generate a bias current. The peak detection and bias voltage adjustment circuit is coupled between the bias current and a ground voltage and coupled to the first terminal, and is arranged to perform peak detection and bias voltage adjustment, in order to correspondingly generate a first signal at a node. The low-pass filter is coupled to the node, and is arranged to low-pass filter the first signal in order to generate a filtered signal. The feedback control circuit is coupled to the low-pass filter and coupled to the first terminal and the second terminal, and is arranged to perform feedback control according to the filtered signal in order to generate an oscillation signal at one or both of the first terminal and the second terminal.

At least one embodiment of the present invention provides an oscillation device which comprises the crystal oscillator control circuit mentioned above. The oscillation device may further comprise: the crystal coupled between the first terminal and the second terminal; and a first capacitor and a second capacitor coupled to the first terminal and the second terminal, respectively.

An advantage provided by the present invention is that the crystal oscillator control circuit does not need any resistor or analog switch. More particularly, the problem of unwanted area occupation of configuring a feedback resistor can be avoided. In addition to the above advantages, the crystal oscillator control circuit is also insensitive to leakage current. Compared with related art, the crystal oscillator control circuit and the oscillation device of the present invention may be implemented as a resistor-less circuit and device respectively, while also achieving the required functions while maintaining a considerably small size.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
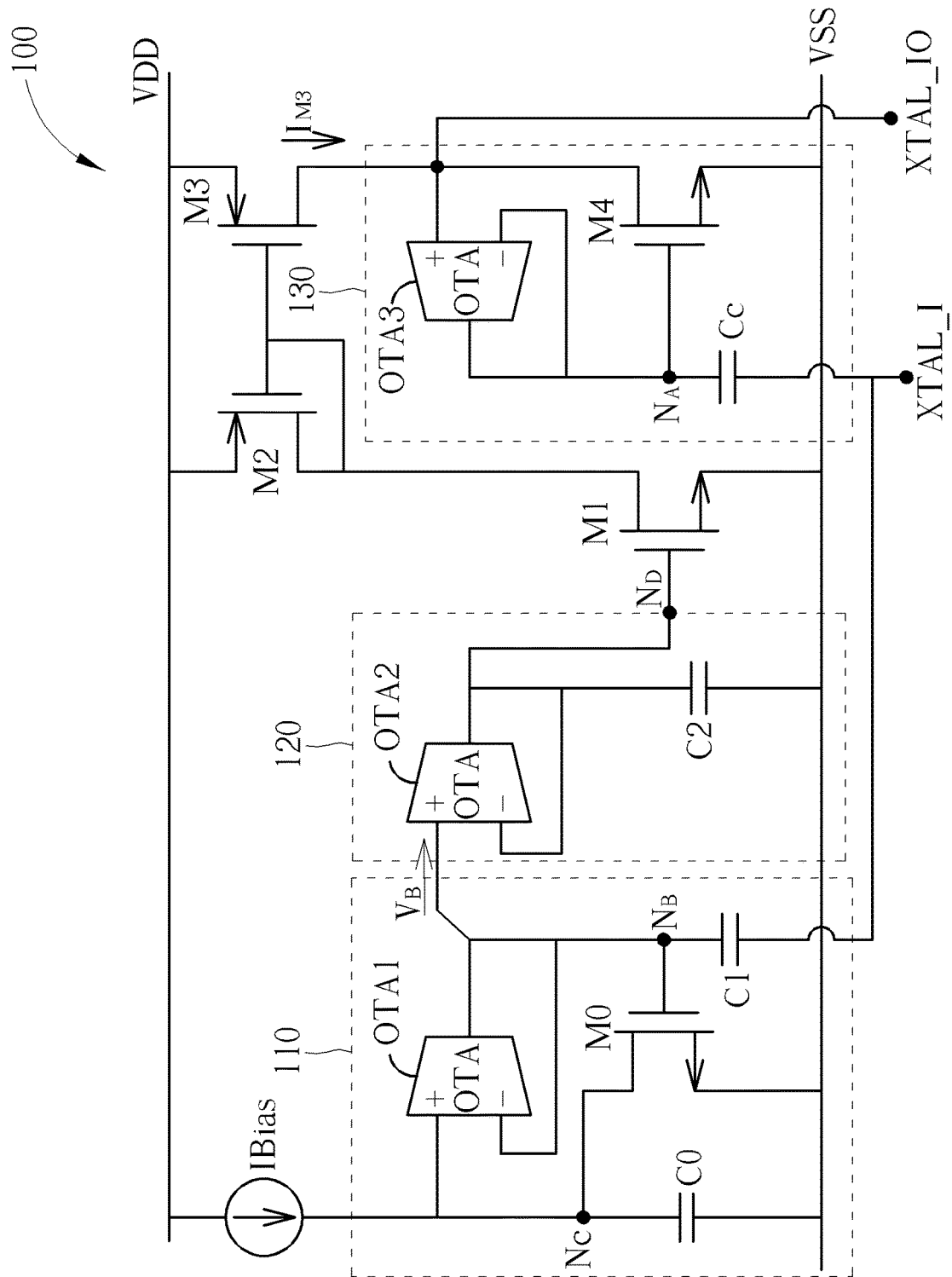
FIG. 1 is a diagram illustrating a crystal oscillator control circuit according to an embodiment of the present invention.

FIG. 1 is a diagram illustrating a crystal oscillator control circuit 100 according to an embodiment of the present invention. The crystal oscillator control circuit 100 may comprise terminals XTAL_I and XTAL_IO, a current source for generating a bias current IBias, a peak detection and bias voltage adjustment circuit 110 and a low-pass filter 120, and may further comprise a feedback control circuit, such as that shown on the right side of the low-pass filter 120 within the architecture shown in FIG. 1, wherein the current source is coupled to the power supply voltage VDD, and the peak detection and bias voltage adjustment circuit 110 is coupled between the bias current IBias and the ground voltage VSS, and may be coupled to the terminal XTAL_I. The low-pass filter 120 is coupled to the peak detection and bias voltage adjustment circuit 110, and the feedback control circuit is coupled to the low-pass filter 120 and coupled to the terminals XTAL_I and XTAL_IO. The architecture shown in FIG. 1 adopts some types of Metal Oxide Semiconductor Field Effect Transistors (MOSFETs), such as P-type and N-type MOSFETs, but the present invention is not limited thereto.

As shown in FIG. 1, the peak detection and bias voltage adjustment circuit 110 may comprise an operational transconductance amplifier (OTA) OTA1, a transistor M0 (such as an N-type MOSFET) and a capacitor C0 coupled between the bias current IBias and the ground voltage VSS, and a capacitor C1 coupled between the node $N_B$ and the terminal XTAL_I. The operational transconductance amplifier OTA1 comprises a first positive input terminal, a first negative input terminal and a first output terminal (e.g. the terminals denoted with "+" and "−" on the left side thereof and the terminal on the right side thereof, respectively), wherein the first positive input terminal is coupled to the bias current IBias, the first negative input terminal and the first output terminal are coupled to each other and are both coupled to the node $N_B$, and the control terminal (e.g. the gate terminal) of the transistor M0 may be coupled to the node $N_B$. In addition, the low-pass filter 120 may comprise the operational transconductance amplifier OTA2, and may comprise the capacitor C2 coupled between the node $N_D$ and the ground voltage VSS. The operational transconductance amplifier OTA2 comprises a second positive input terminal, a second negative input terminal and a second output terminal (e.g. the terminals denoted with "+" and "−" on the left side thereof and the terminal on the right side thereof, respectively), wherein the second positive input terminal is coupled to the node $N_B$, and the second negative input terminal and the second output terminal are coupled to each other and are both coupled to the node $N_D$. Further, the feedback control circuit may comprise the operational transconductance amplifier OTA3, the capacitor Cc coupled between the node $N_A$ and the terminal XTAL_I, the transistors M1 and M2 coupled between the power supply voltage VDD and the ground voltage VSS and located on a first current path, and the transistors M3 and M4 coupled between power supply voltage VDD and the ground voltage VSS and located on a second current path. The first current path may be the current path passing through the transistors M2 and M1 from top to bottom, and the second current path may be the current path passing through the transistors M3 and M4 from top to bottom. The operational transconductance amplifier OTA3 comprises a third positive input terminal, a third negative input terminal and a third output terminal (e.g. the terminals denoted with "+" and "−" on the right side thereof and the terminal on the left side thereof, respectively), wherein the third positive input terminal is coupled to the terminal XTAL_IO, and the third negative input terminal and the third output terminal are coupled to each other and are both coupled to the node $N_A$. The control terminal of the transistor M1 (such as the gate terminal thereof) is coupled to the low-pass filter 120, and two terminals of multiple terminals of the transistor M2 are coupled to each other, making the transistor M2 be configured into a dual-terminal component, such as a diode-connected transistor. The multiple terminals of the transistor M2 may comprise a source terminal, a gate terminal and a drain terminal, wherein the gate terminal and the drain terminal of these terminals are coupled to each other. The control terminal of the transistor M3 (such as the gate terminal thereof) is coupled to the control terminal of the transistor M2 (such as the gate terminal thereof), and the control terminal of the transistor M4 (such as the gate terminal thereof) is coupled to the node $N_A$.

According to this embodiment, the terminals XTAL_I and XTAL_IO may be arranged to couple the crystal oscillator control circuit 100 to a crystal, and the peak detection and bias voltage adjustment circuit 110 may be arranged to perform peak detection and bias voltage adjustment, in order to correspondingly generate a first signal (such as signal $V_B$) at the node $N_B$. In addition, the low-pass filter 120 may be coupled to the node $N_B$, and may be arranged to perform low-pass filtering on the first signal (such as the signal $V_B$ on the node $N_B$) in order to generate a filtered signal (such as signal $V_D$) at the node $N_D$. Further, the control terminal of the transistor M1 (such as the gate terminal thereof) receives the filtered signal (such as signal $V_D$ on the node $N_D$). The feedback control circuit may be arranged to perform feedback control according to the filtered signal (such as the signal $V_D$) in order to generate an oscillation signal to at least one terminal (e.g. one or more terminals) within the terminals XTAL_I and XTAL_IO, such as the oscillation signals $V_{XTAL\_I}$ and $V_{XTAL\_IO}$ on the terminals XTAL_I and XTAL_IO, respectively, but the present invention is not limited thereto. As shown in FIG. 1, the gain stage 130 in the feedback control circuit may comprise the operational transconductance amplifier OTA3, the transistor M4 and the capacitor Cc, wherein two other terminals of the transistor M3 (such as the source terminal and drain terminal thereof) are respectively coupled to the power supply voltage VDD and the third positive input terminal, and two other terminals of the transistor M4 (such as the drain terminal and source terminal thereof) are respectively coupled to the third positive input terminal and the ground voltage VSS. The gain stage 130 may provide gain and feedback path for generating the aforementioned oscillation signal (such as the oscillation signals $V_{XTAL\_I}$ and $V_{XTAL\_IO}$ on the terminals XTAL_I and XTAL_IO respectively). In addition, the gain stage 130 may utilize the capacitor Cc to perform leakage current isolation, and more particularly, to isolate any leakage current at the terminal XTAL_I.

Since the capacitor Cc isolates the gate of the transistor M4 from the terminal XTAL_I, the gain stage 130 will be insensitive to the leakage current of the terminal XTAL_I. The operational transconductance amplifier OTA3 provides a feedback loop, wherein the bias current thereof may be adjusted for a high output impedance. Hence, the AC signal on the terminal XTAL_I may be coupled to the gate of the transistor M4 without suffering from phase shift and amplitude attenuation. In addition, the peak detection and bias voltage adjustment circuit 110 may adjust the bias current of the operational transconductance amplifier OTA1, allowing the AC signal on the terminal XTAL_I to be easily coupled to the node $N_B$, and more particularly, the operational transconductance amplifier OTA1 will not introduce a DC shift effect between the nodes $N_C$ and $N_B$. Further, the low-pass filter 120 may provide a clean signal at the node $N_D$ for the gate of the transistor M1, thereby indirectly providing a clean bias current for the transistor M4, and may control the bias current of the operational transconductance amplifier OTA2 to be adjusted to minimize (or eliminate) any possible ripple on the node D, but the present invention is not limited thereto. According to some embodiments, the operational transconductance amplifier OTA1 may provide a feedback path.

As illustrated by the architecture shown in FIG. 1, the present invention provides a crystal oscillator control circuit, which does not apply any resistor or analog switch, and the crystal oscillator control circuit also integrates an AGC loop and leakage isolation capacitor in a same architecture without introducing a side effect. More particularly, the resistor-free and analog switch-free crystal oscillator control circuit proposed by the present invention may also solve various problems existing in the related art, and thus the present invention can avoid the trade-off between solving existing problems and mitigating newly-introduced problems, wherein the novel architecture proposed by the present invention is insensitive to the leakage current, and can also avoid the requirement for large feedback resistors. In addition, the present invention is capable of reducing the circuit power, reducing sensitivity to PCB current leakage, and reducing related costs (such as material and manufacturing costs).

Figure 2:
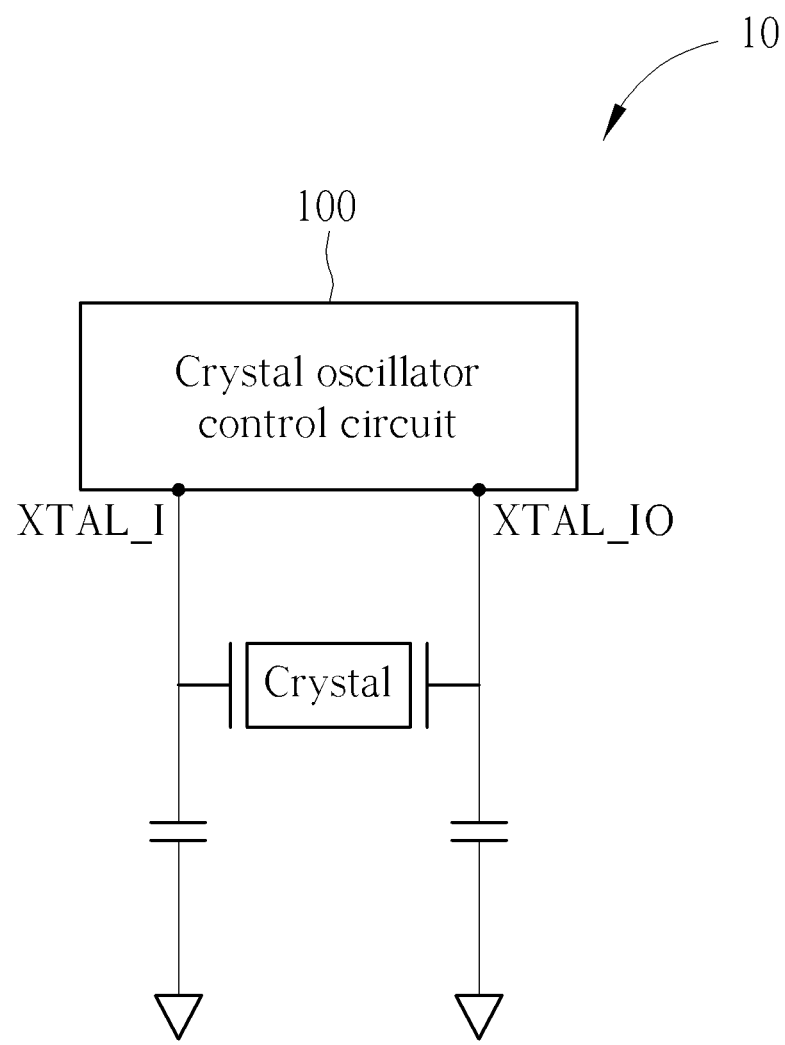
FIG. 2 illustrates an example of an oscillation device which comprises the crystal oscillator control circuit shown in FIG. 1.

FIG. 2 illustrates an example of an oscillation device 10 which comprises the crystal oscillator control circuit 100 shown in FIG. 1. As shown in FIG. 2, the oscillation device 10 may further comprise the crystal coupled between the terminals XTAL_I and XTAL_IO, and a first capacitor and a second capacitor coupled to the terminals XTAL_I and XTAL_IO, respectively. For example, the upper terminals of the first capacitor and the second capacitor are coupled to the terminals XTAL_I and XTAL_IO respectively, and the lower terminals of the first capacitor and the second capacitor are coupled to ground.

Based on the architecture shown in FIG. 1 and FIG. 2, the crystal oscillator control circuit and oscillation device of the present invention avoid using resistors and analog switches. More particularly, the crystal oscillator control circuit and oscillation device with no resistor and analog switch as provided by the present invention can completely solve various problems encountered in the related arts.

Figure 3:
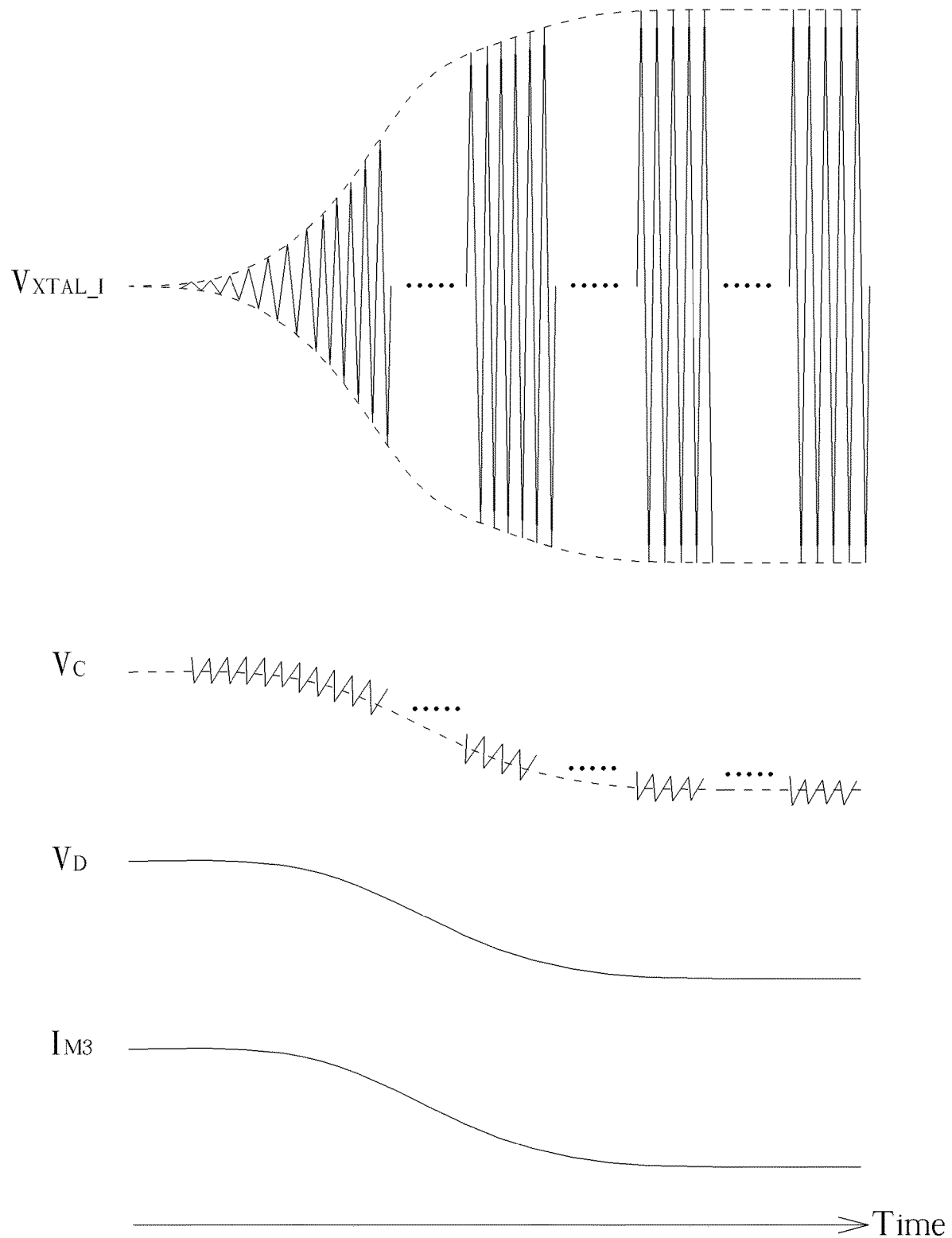
FIG. 3 illustrates some examples of related signals of the crystal oscillator control circuit shown in FIG. 1.

FIG. 3 illustrates some examples of related signals of the crystal oscillator control circuit 100 shown in FIG. 1, such as the oscillation signal $V_{XTAL\_I}$, the signals $V_C$ and $V_D$, and the current $I_{M3}$ of the transistor M3, but the present invention is not limited thereto. Regarding the initialization, at the beginning of powering on of the crystal oscillator control circuit 100, the bias current of the transistor M4 may be determined by the bias current IBias and transistor ratio, wherein a relatively large current may be used for a better startup. When the oscillation amplitude of the aforementioned oscillation signal (such as the oscillation signals $V_{XTAL\_I}$ and $V_{XTAL\_IO}$ on the terminals XTAL_I and XTAL_IO, respectively) increases, the DC voltage on the node $N_C$ decreases, and thus the DC voltage on the node $N_B$ also decreases. The operational transconductance amplifier OTA2 and the capacitor C2 may allow the DC signal on the node $N_B$ to pass, but attenuate the AC signal. Hence, the signal $V_D$ on the node $N_D$ may have a decreasing voltage that is slowly changed. In this way, when the oscillation amplitude increases, the bias current of the transistor M4 decreases. Finally, the variations of the related signals may reach a balance point. As a result, the aforementioned oscillation signal (such as the oscillation signals $V_{XTAL\_I}$ and $V_{XTAL\_IO}$ on the terminals XTAL_I and XTAL_IO, respectively) may continue oscillating and the bias current may remain constant.

According to some embodiments, the crystal oscillator control circuit 100 shown in FIG. 1 and the oscillation device 10 shown in FIG. 2 are applicable to associated designs of various products, such as that of a crystal oscillator (XOSC), phase-locked loop (PLL), clock, and so on.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A crystal oscillator control circuit, comprising:
    a first terminal and a second terminal, arranged to couple the crystal oscillator control circuit to a crystal;
    a current source, coupled to a power supply voltage, the current source arranged to generate a bias current;
    a peak detection and bias voltage adjustment circuit, coupled between the bias current and a ground voltage and coupled to the first terminal, wherein the peak detection and bias voltage adjustment circuit is arranged to perform peak detection and bias voltage adjustment in order to correspondingly generate a first signal at a node;
    a low-pass filter, coupled to the node, the low-pass filter arranged to low-pass filter the first signal in order to generate a filtered signal; and
    a feedback control circuit, coupled to the low-pass filter and coupled to the first terminal and the second terminal, the feedback control circuit arranged to perform feedback control according to the filtered signal, in order to generate an oscillation signal at one or both of the first terminal and the second terminal;
    wherein the peak detection and bias voltage adjustment circuit comprises:
        a first operational transconductance amplifier (OTA), comprising a first positive input terminal, a first negative input terminal and a first output terminal, wherein the first positive input terminal is coupled to the bias current, and the first negative input terminal and the first output terminal are coupled to each other and are coupled to the node.

2. The crystal oscillator control circuit of claim 1, wherein the peak detection and bias voltage adjustment circuit further comprises:
    a transistor, coupled between the bias current and the ground voltage, wherein a control terminal of the transistor is coupled to the node; and
    a capacitor, coupled between the bias current and the ground voltage.

3. The crystal oscillator control circuit of claim 2, wherein the peak detection and bias voltage adjustment circuit further comprises:
    another capacitor, coupled between the node and the first terminal.

4. The crystal oscillator control circuit of claim 1, wherein the low-pass filter comprises:
    a second operational transconductance amplifier (OTA), comprising a second positive input terminal, a second negative input terminal and a second output terminal, wherein the second positive input terminal is coupled to the node, and the second negative input terminal and the second output terminal are coupled to each other and are coupled to another node;
    wherein the low-pass filter generates the filtered signal at the other node.

5. The crystal oscillator control circuit of claim 4, wherein the low-pass filter further comprises:
    a capacitor, coupled between the other node and the ground voltage.

6. The crystal oscillator control circuit of claim 1, wherein the feedback control circuit comprises:
    a third operational transconductance amplifier (OTA), comprising a third positive input terminal, a third negative input terminal and a third output terminal, wherein the third positive input terminal is coupled to the second terminal, and the third negative input terminal and the third output terminal are coupled to each other and are coupled to another node; and
    a capacitor, coupled between the other node and the first terminal.

7. The crystal oscillator control circuit of claim 6, wherein the feedback control circuit comprises:
  a first transistor and a second transistor, coupled between the power supply voltage and the ground voltage, and located on a first current path, wherein a control terminal of the first transistor is coupled to the low-pass filter in order to receive the filtered signal, and two terminals among multiple terminals of the second transistor are coupled to each other, configuring the second transistor into a dual-terminal component; and
  a third transistor and a fourth transistor, coupled between the power supply voltage and the ground voltage, and located on a second current path, wherein a control terminal of the third transistor is coupled to a control terminal of the second transistor, and a control terminal of the fourth transistor is coupled to the other node.

8. The crystal oscillator control circuit of claim 7, wherein a gain stage in the feedback control circuit comprises:
  the third OTA, wherein two other terminals of the third transistor are coupled to the power supply voltage and the third positive input terminal, respectively;
  the fourth transistor, wherein two other terminals of the fourth transistor are coupled to the third positive input terminal and the ground voltage, respectively; and
  the capacitor;
  wherein the gain stage provides gain and a feedback path for generating the oscillation signal, and utilizes the capacitor to perform leakage current isolation.

9. An oscillation device comprising the crystal oscillator control circuit of claim 1, wherein the oscillation device further comprises:
  the crystal, coupled between the first terminal and the second terminal; and
  a first capacitor and a second capacitor, coupled to the first terminal and the second terminal, respectively.

10. A crystal oscillator control circuit, comprising:
  a first terminal and a second terminal, arranged to couple the crystal oscillator control circuit to a crystal;
  a current source, coupled to a power supply voltage, the current source arranged to generate a bias current;
  a peak detection and bias voltage adjustment circuit, coupled between the bias current and a ground voltage and coupled to the first terminal, wherein the peak detection and bias voltage adjustment circuit is arranged to perform peak detection and bias voltage adjustment in order to correspondingly generate a first signal at a node;
  a low-pass filter, coupled to the node, the low-pass filter arranged to low-pass filter the first signal in order to generate a filtered signal; and
  a feedback control circuit, coupled to the low-pass filter and coupled to the first terminal and the second terminal, the feedback control circuit arranged to perform feedback control according to the filtered signal, in order to generate an oscillation signal at one or both of the first terminal and the second terminal;
  wherein the low-pass filter comprises:
    a second operational transconductance amplifier (OTA), comprising a second positive input terminal, a second negative input terminal and a second output terminal, wherein the second positive input terminal is coupled to the node, and the second negative input terminal and the second output terminal are coupled to each other and are coupled to another node; wherein the low-pass filter generates the filtered signal at the other node.

11. The crystal oscillator control circuit of claim 10, wherein the low-pass filter further comprises:
  a capacitor, coupled between the other node and the ground voltage.

12. The crystal oscillator control circuit of claim 10, wherein the feedback control circuit comprises:
  a third operational transconductance amplifier (OTA), comprising a third positive input terminal, a third negative input terminal and a third output terminal, wherein the third positive input terminal is coupled to the second terminal, and the third negative input terminal and the third output terminal are coupled to each other and are coupled to another node; and
  a capacitor, coupled between the other node and the first terminal.

13. The crystal oscillator control circuit of claim 12, wherein the feedback control circuit comprises:
  a first transistor and a second transistor, coupled between the power supply voltage and the ground voltage, and located on a first current path, wherein a control terminal of the first transistor is coupled to the low-pass filter in order to receive the filtered signal, and two terminals among multiple terminals of the second transistor are coupled to each other, configuring the second transistor into a dual-terminal component; and
  a third transistor and a fourth transistor, coupled between the power supply voltage and the ground voltage, and located on a second current path, wherein a control terminal of the third transistor is coupled to a control terminal of the second transistor, and a control terminal of the fourth transistor is coupled to the other node.

14. The crystal oscillator control circuit of claim 13, wherein a gain stage in the feedback control circuit comprises:
  the third OTA, wherein two other terminals of the third transistor are coupled to the power supply voltage and the third positive input terminal, respectively;
  the fourth transistor, wherein two other terminals of the fourth transistor are coupled to the third positive input terminal and the ground voltage, respectively; and
  the capacitor;
  wherein the gain stage provides gain and a feedback path for generating the oscillation signal, and utilizes the capacitor to perform leakage current isolation.

15. An oscillation device comprising the crystal oscillator control circuit of claim 10, wherein the oscillation device further comprises:
  the crystal, coupled between the first terminal and the second terminal; and
  a first capacitor and a second capacitor, coupled to the first terminal and the second terminal, respectively.

* * * * *